United States Patent
Schoenknecht et al.

(10) Patent No.: US 9,374,068 B2
(45) Date of Patent: Jun. 21, 2016

(54) CIRCUIT SYSTEM HAVING AT LEAST TWO INVERTER MODULES CONNECTED IN PARALLEL, METHOD FOR CONNECTING AT LEAST TWO INVERTER MODULES IN PARALLEL AND CIRCUIT SUBSTRATE FOR A GATE DRIVER CIRCUIT OF AN INVERTER MODULE

(75) Inventors: Andreas Schoenknecht, Renningen (DE); Hartmut Sparka, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 758 days.

(21) Appl. No.: 13/638,386

(22) PCT Filed: Feb. 3, 2011

(86) PCT No.: PCT/EP2011/051536
§ 371 (c)(1),
(2), (4) Date: Dec. 11, 2012

(87) PCT Pub. No.: WO2011/120728
PCT Pub. Date: Oct. 6, 2011

(65) Prior Publication Data
US 2013/0076407 A1  Mar. 28, 2013

(30) Foreign Application Priority Data
Apr. 1, 2010 (DE) .......................... 10 2010 003 614

(51) Int. Cl.
*H03K 3/012* (2006.01)
*H02M 1/088* (2006.01)
*H02M 7/493* (2007.01)

(52) U.S. Cl.
CPC .............. *H03K 3/012* (2013.01); *H02M 1/088* (2013.01); *H02M 7/493* (2013.01); *Y10T 29/49002* (2015.01)

(58) Field of Classification Search
CPC ....... H02M 1/08; H02M 1/084; H02M 1/088; H02M 3/285; H02M 7/08; H02M 7/49; H02M 7/493; H02M 2007/4822; H02J 3/38; H02J 3/46; H03K 5/159; H03K 5/1508; H03K 2005/0015; H03K 2005/00215
USPC ...................................... 363/65, 71, 123, 131
See application file for complete search history.

(56) References Cited

U.S. PATENT DOCUMENTS

| 5,450,309 A   | 9/1995 | Rohner |
| 5,757,634 A * | 5/1998 | Ferens ............................ 363/72 |

(Continued)

FOREIGN PATENT DOCUMENTS

| EP | 0 511 344 | 11/1992 |
| EP | 0 959 563 | 11/1999 |

(Continued)

OTHER PUBLICATIONS

International Search Report, PCT International Application No. PCT/EP2011/051536, dated Dec. 16, 2011.

*Primary Examiner* — Adolf Berhane
(74) *Attorney, Agent, or Firm* — Norton Rose Fulbright US LLP

(57) ABSTRACT

A circuit system having at least two inverter modules connected in parallel, each of which includes an inverter circuit having power semiconductor circuit breakers and a gate driver circuit for controlling the power semiconductor circuit breakers; the gate driver circuit of a first inverter module includes a signal transmission circuit via which a control signal is transmittable from a low-voltage side to a high-voltage side, and a first driver output terminal which is electrically connected to the first driver input terminals of the gate driver circuits of the inverter modules connected in parallel, and via which the high-voltage side control signal or a control signal deduced therefrom is transmittable to the gate driver circuits of the inverter modules connected in parallel. The power semiconductor circuit breakers of the inverter circuits of the inverter modules, connected in parallel to the first inverter module, are controlled based on the transmitted control signal.

8 Claims, 2 Drawing Sheets

(56) References Cited

U.S. PATENT DOCUMENTS

2003/0231046 A1* 12/2003 Giacomini et al. ............ 327/333
2004/0227476 A1* 11/2004 Guerra et al. ................. 318/254
2008/0049462 A1* 2/2008 Itkonen et al. ................. 363/37

FOREIGN PATENT DOCUMENTS

| EP | 1 324 480 | 7/2003 |
| EP | 1 542 348 | 6/2005 |

* cited by examiner

CIRCUIT SYSTEM HAVING AT LEAST TWO INVERTER MODULES CONNECTED IN PARALLEL, METHOD FOR CONNECTING AT LEAST TWO INVERTER MODULES IN PARALLEL AND CIRCUIT SUBSTRATE FOR A GATE DRIVER CIRCUIT OF AN INVERTER MODULE

FIELD OF THE INVENTION

The present invention relates to a circuit system having at least two inverter modules connected in parallel, a method for connecting at least two inverter modules in parallel and a circuit substrate for a gate driver circuit of an inverter module.

BACKGROUND INFORMATION

For driving hybrid and electric vehicles, electric machines in the form of polyphase machines are usually used which are operated in conjunction with pulse-controlled inverters, often also referred to as inverters. In this case, the electric machines are operated optionally in motor or generator mode. In motor mode, the electric machine generates a drive torque which supports, when used in a hybrid vehicle, an internal combustion engine during an acceleration phase, for example. In generator mode, the electric machine generates electrical energy which is stored in an energy storage unit, e.g., a traction battery. A DC link capacitor is provided to stabilize the battery voltage. The operation mode and performance of the electric machine are adjusted via the pulse-controlled inverter. The pulse-controlled inverter includes a power semiconductor circuit breaker, in the following referred to in short as power circuit breaker, e.g., MOSFETs (metal-oxide-semiconductor field-effect transistors), IGBTs (insulated gate bipolar transistors) or MCTs (MOS controlled thyristors), which are controlled in a potential-separating manner via a gate driver circuit.

In the hybrid and electric vehicle market, pulse-controlled inverters of very different performance and current categories are demanded. In order to increase the performance of a pulse-controlled inverter, multiple pulse-controlled inverters are connected in parallel (cf., European Patent No. EP 0 511 344 B1, for example). A higher-level gate driver circuit may be used here which is suitable to control multiple pulse-controlled inverters connected in parallel, or multiple pulse-controlled inverter modules, including the associated gate driver circuits, are connected in parallel.

SUMMARY

In accordance with the present invention, a circuit system is provided having at least two inverter modules connected in parallel, each of which includes one inverter circuit having power circuit breakers and one gate driver circuit for controlling the power circuit breakers. The gate driver circuit of a first inverter module, which in the following is referred to as master module, includes a signal transmission circuit, through which a control signal is transmittable from a low-voltage side to a high-voltage side, and a first driver output terminal, which is electrically connected to the first driver input terminals of the gate driver circuits of the inverter modules connected in parallel, referred to in the following as slave modules, and via which the high-voltage side control signal or a control signal deduced therefrom is transmittable to the gate driver circuits of the slave modules. The power circuit breakers of the inverter circuits of the slave modules, which are connected in parallel to the master module, are then controlled based on the transmitted control signal.

The present invention also provides a method for connecting at least two inverter modules in parallel, each of which includes one inverter circuit having power circuit breakers and one gate driver circuit for controlling the power circuit breakers. Here, a control signal is transmitted by a gate driver circuit of a master module from a low-voltage side to a high-voltage side; the high-voltage side control signal or a control signal deduced therefrom is transmitted to the gate driver circuits of the slave modules connected in parallel, and the inverters of the slave modules connected in parallel are controlled based on the transmitted control signal.

By connecting entire inverter modules in parallel, i.e., inverter circuits including associated gate driver circuits, an application-specific development, which is often associated with great development expenditures, of a higher-level gate driver circuit for controlling multiple pulse-controlled inverter circuits connected in parallel may be dispensed with. One main problem of the parallel connection of inverter modules is, however, runtime tolerances in the control paths which result in the power circuit breakers connected in parallel not connecting exactly at the same time so that undesirable cross currents arise among the power circuit breakers. The fact that not the low-voltage side control signal, as is customary, but the high-voltage side control signal or a control signal deduced therefrom, i.e., further processed, is transmitted to the gate drive circuits of the slave modules, and is used for controlling the power circuit breakers present there, means that significant runtime differences may be avoided which occur, for example, due to component tolerances in the transmission circuits of the gate driver circuits when the control signal is transmitted from the low-voltage side to the high-voltage side. The best case scenario is that the balance chokes, which are typically used for preventing cross currents, in the connecting lines between the pulse-controlled inverter and the load, i.e., the polyphase machine, for example, may be completely dispensed with. The balance chokes may at least have significantly smaller dimensions. This is particularly advantageous because this type of balance chokes represents a significant cost and installation space factor.

In order to achieve the highest possible degree of integration for the inverter modules, the inverter modules may also each include a DC link capacitor which is used for stabilizing an input voltage of the particular inverter circuit. Moreover, the gate driver circuit of the master module may also include a monitoring circuit for monitoring the power circuit breakers and/or a voltage supply for the gate driver circuit of the master module.

According to one specific embodiment of the present invention, the gate driver circuit of the master module includes a driver output stage circuit, the first driver output terminal being electrically connected to the driver output stage circuit, in particular to an input terminal or an output terminal of the driver output stage.

The driver output stage of a gate driver circuit is used for intensifying the high-voltage side control signal to the level ultimately required for controlling the power circuit breakers and thus represents the last circuit unit within a gate driver circuit. It is thus advantageous to pick off the high-voltage side control signal to be transmitted to the slave module only in the region of the driver output stage to, in particular, avoid or to compensate for runtime differences which occur while the signals are transmitted from the low-voltage side to the high-voltage side. A pick-off downstream from the driver output stage offers the advantage that runtime delays which result from component tolerances within the driver output stages may be also avoided. In contrast to that, a pick-off upstream from the driver output stage offers the advantage that a potential overload of the driver output stage may be reliably avoided. The driver output stage may also include multiple partial output stages, it being advantageous for the reasons mentioned above to connect the first driver output terminal to the input terminal or the output terminal of the last partial output stage. Depending on a specific application, the driver output terminal may, however, fundamentally also be connected to every terminal in the region of the driver output stage. It is merely pivotal that runtime differences are avoided to the greatest possible extent, while ensuring reliable operation.

According to another specific embodiment of the present invention, the gate driver circuit of the master module has a second driver output terminal which is electrically connected to the second driver input terminals of the gate driver circuits of the slave module and via which the high-voltage side reference grounds of the gate driver circuits of all inverter modules connected in parallel are combinable so that identical reference potentials prevail in all inverter modules connected in parallel.

Another specific embodiment of the present invention provides that the gate driver circuit of the master module has a third driver output terminal which is electrically connected to the third driver input terminals of the gate driver circuits of the slave modules and via which voltage supplies of the gate driver circuits of all inverter modules connected in parallel are connectable in parallel.

This type of parallel connection of the voltage supplies of the gate driver circuits offers the advantage that a voltage monitoring circuit integrated into the gate driver circuit of the master module may carry out higher-level voltage monitoring so that voltage monitoring is no longer required in the slave modules; this may be used to dispense with corresponding equipment of the circuit substrates of the gate driver circuits of the inverter modules connected in parallel, and thus save even more costs and effort.

The gate driver circuit of the master module also advantageously has a first driver input terminal via which a high-voltage side control signal or a control signal deduced therefrom is receivable based on which the power circuit breakers of the inverter circuit of the master module are controlled. In this case, the first driver output terminal of the gate driver circuit of the master module is electrically connected via connecting lines to both the driver input terminal of the gate driver circuit of the master module and the first driver input terminals of the gate driver circuits of the slave modules. To compensate for the runtime differences, the line lengths of the connecting lines are established in such a way that the same signal runtimes generally result. In this way, a further increase in the switching synchronization of the power circuit breakers may be achieved.

The present invention also provides a circuit substrate for a gate driver circuit of an inverter module, the gate driver circuit being used for controlling power circuit breakers of an inverter circuit of the inverter module. For this purpose, the circuit substrate is equippable in a first partial region with components which are used for implementing a signal transmission of a control signal from a low-voltage side to a high-voltage side. The circuit substrate has at least one first driver output contact point via which the high-voltage side control signal or a control signal deduced therefrom is transmittable to the gate driver circuits of inverter modules connected in parallel. Moreover, the circuit substrate has at least one first driver input contact point via which a high-voltage side control signal or a control signal deduced therefrom is receivable based on which the power circuit W breakers are controlled.

By providing both a driver output contact point and a driver input contact point it is possible to use the circuit substrate in an inverter module during stand-alone operation and in an inverter module during parallel operation. According to one advantageous specific embodiment of the present invention, only the driver output contact point is short-circuited with the driver input contact point during stand-alone operation. If the circuit substrate is used in an inverter module which is connected in parallel with other inverter modules, a circuit system according to the present invention having at least two inverter modules connected in parallel may be implemented. Here, the circuit substrate according to the present invention may be used in both a master module and a slave module. This means that, depending on the task distribution among the inverter modules, the circuit substrate may be equipped in such a way that a control signal is transmittable from the low-voltage side to the high-voltage side and may subsequently be relayed to the inverter modules connected in parallel, or that only a high-voltage side control signal which is generated by a gate driver circuit of another inverter module may be received, based on which the power circuit breakers may be controlled. The circuit substrate according to the present invention may thus be used universally so that application-specific development times and costs may be avoided, and the component diversity may be considerably reduced.

According to one specific embodiment of the present invention, the circuit substrate is equippable in a second partial region with components which are used for implementing a driver output stage, the first driver output contact point and the first driver input contact point being electrically connected to the gate driver circuit in the region of the driver output stage, in particular upstream or downstream from the driver output stage.

Another specific embodiment of the present invention provides that the circuit substrate has a second driver output contact point and a second driver input contact point, the second driver output contact point being electrically connectable to the second driver input contact points of the gate driver circuits of the inverter modules connected in parallel, and high-voltage side reference grounds of the gate driver circuits of the inverter modules connected in parallel being combinable.

According to one specific embodiment of the present invention, the circuit substrate also has a third driver output contact point and a third driver input contact point, the third driver output contact point being electrically connectable to the third driver input contact points of the gate driver circuits of the inverter modules connected in parallel, and voltage supplies of the gate driver circuits of the inverter modules connected in parallel thus being connectable in parallel.

Additional features and advantages of specific embodiments of the present invention result from the description below with reference to the figures.

DETAILED DESCRIPTION OF EXAMPLE EMBODIMENTS

In the figures, the same reference symbols identify components that are identical or have identical functions.

Figure 1:
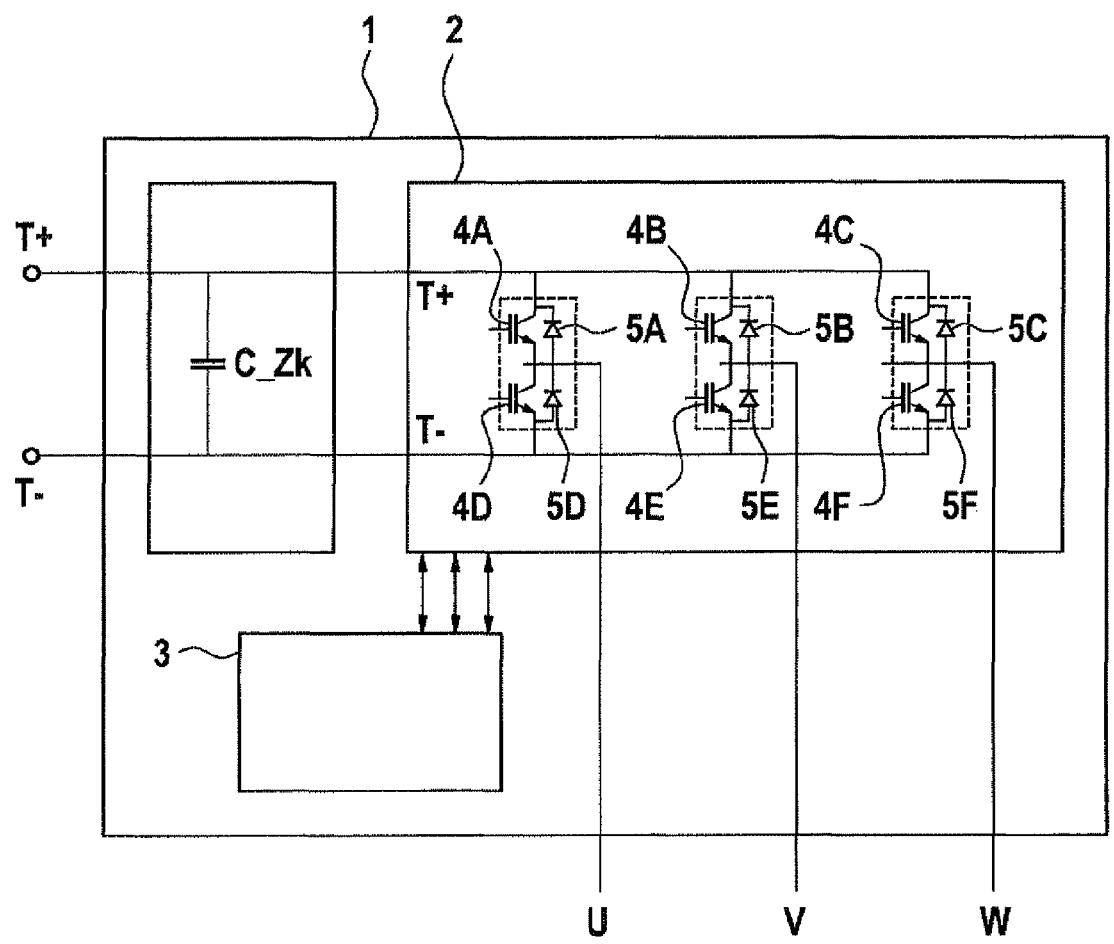
FIG. 1 shows a schematic representation of an inverter module.

FIG. 1 shows a schematic representation of an inverter module 1 which includes a DC link capacitor C_Zk, an inverter circuit in the form of a pulse-controlled inverter 2, and a gate driver circuit 3. Pulse-controlled inverter 2 has multiple power components in the form of power circuit breakers 4A through 4F which are connected to individual phases U, V, W of an electric machine (not illustrated), and which switch phases U, V, W either against a high reference potential T+ or a low reference potential T−. Power circuit breakers 4A through 4C, which are connected to high reference potential T+, are also referred to here as high side breakers, and power circuit breaker elements 4D through 4F, which are connected to low reference potential T−, are referred to as low side breakers. Pulse-controlled inverter 2 further includes additional power component elements in the form of freewheeling diodes 5A through 5F which are situated in the form of a six-pulse rectifier bridge circuit in the illustrated exemplary embodiment. In this case, each of diodes 5A through 5F is situated in parallel to one of power circuit breakers 4A through 4F. Power circuit breakers 4A through 4F may, for example, be designed as IGBTs or MOSFETs. Diodes 5A through 5F do not have to be implemented as separate components, but may also be integrated into particular power circuit breakers 4A through 4F as is, for example, already the case with MOSFETs for technological reasons. Pulse-controlled inverter 2 determines the power and mode of operation of the electric machine and is controlled by gate driver circuit 3. Gate driver circuit 3 is, in turn, controlled by a control unit (not illustrated).

Figure 2:
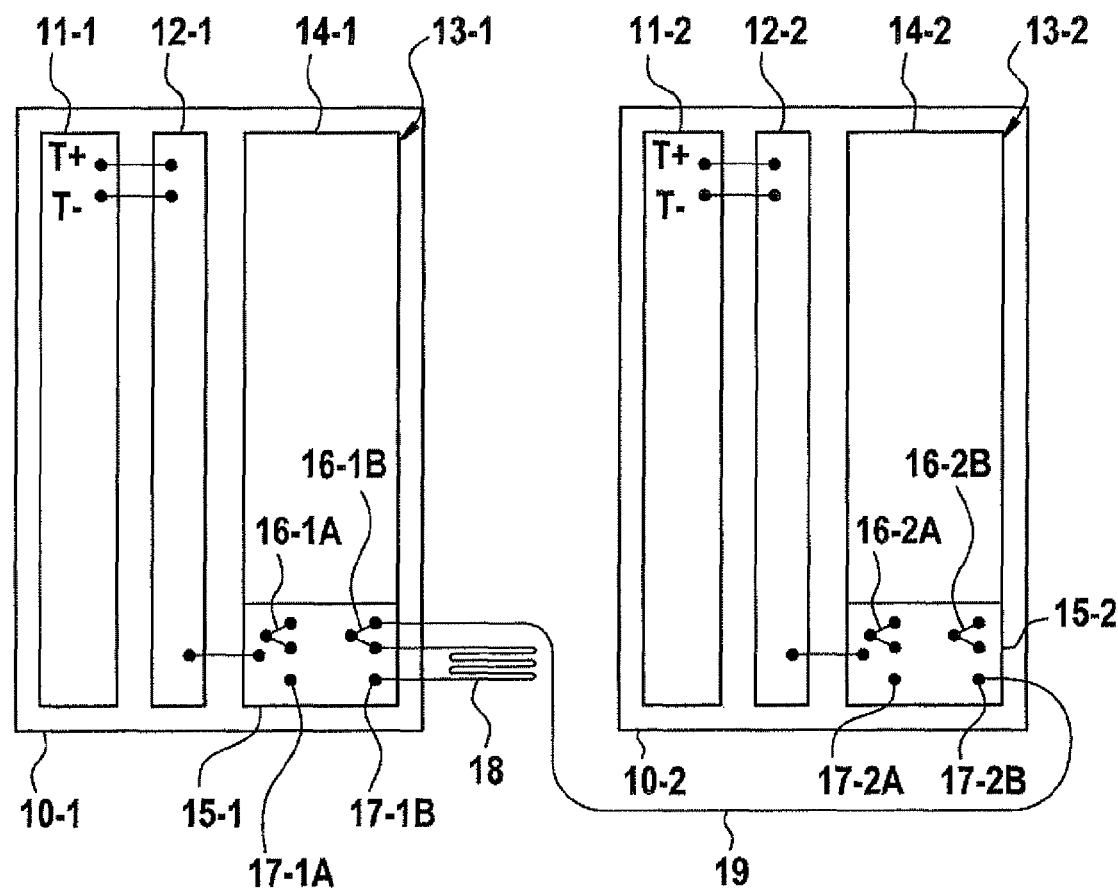
FIG. 2 shows a schematic representation of an example circuit system according to the present invention having two inverter modules connected in parallel.

FIG. 2 shows a schematic representation of an example circuit system according to the present invention having two inverter modules 10-1 and 10-2 connected in parallel; in accordance with the present invention, additional inverter modules may also be connected in parallel. The inverter modules each have a circuit substrate 11-1 and 11-2 for a DC link capacitor, circuit substrates 12-1 and 12-2 for inverter circuits, and circuit substrates 13-1 and 13-2 for gate driver circuits. In contrast to the illustrated specific embodiment, the DC link capacitor, the inverter circuit, and the gate driver circuit may also be at least partially situated on a shared circuit substrate. In this case, inverter modules 10-1 and 10-2 connected in parallel have an identical design except for the equipment (not illustrated) of gate driver circuit substrates 13-1 and 13-2. Circuit substrates 13-1 and 13-2 of the gate driver circuits each have a first partial region 14-1 and 14-2, respectively, which is equippable with components used for implementing a signal transmission circuit. In second partial region 15-1 and 15-2, circuit substrates 13-1 and 13-2 are equippable with components used for implementing a driver output stage. The driver output stage may also include multiple partial output stages. The individual circuit substrates of the inverter modules are electrically interconnected, for example via cable harnesses or lead frames.

A low-voltage control signal supplied by a control unit (not illustrated) to the gate driver circuit of first inverter module 10-1, which is used as the master module, is transmitted from a low-voltage side to a high-voltage side by the signal transmission circuit implemented by corresponding equipment in first partial region 14-1. On circuit substrate 13-1 for the gate driver circuit of the first inverter module, additional partial regions (not illustrated) may be provided which are equippable with components which are used for implementing a voltage monitoring, for example, or a voltage supply of the gate driver circuit. In second partial region 15-1 of circuit substrate 13-1, a driver output stage, which intensifies the high-voltage side control signal to the voltage level required for controlling the power circuit breakers of the inverter circuit, is implemented by corresponding equipment as the last circuit component of the gate driver circuit with regard to the signal flow of the control signal.

In second partial region 15-1, i.e., in the region of the driver output stage, two driver output contact points or driver output terminals 16-1A and 16-1B, and two driver input contact points or driver input terminals 17-1A and 17-1B are provided in each case. Here, driver output terminal 16-1A and driver input terminal 17-1A are each provided upstream from the driver output stage (not explicitly illustrated), and driver output terminal 16-1B and driver input terminal 17-1B are each provided downstream from the driver output stage, which is implemented in that the driver input and driver output contact points are each electrically connected to the supply leads or the end leads of the driver output stage. Similarly, two driver output and driver input contact points 16-2A and 16-2B and 17-2A and 17-2B, respectively, are also provided in each case on circuit substrate 13-2 of inverter module 10-2 connected in parallel which is used as a slave module. As a deviation from the illustrated embodiment variant, it is of course also possible that only one driver input terminal and one driver output terminal are provided in each case. In the case of driver output stages having multiple partial stages, specific embodiments having more than two driver input and output terminals are also conceivable.

According to an example embodiment of the present invention, the high-voltage side control signal or a control signal deduced therefrom by further signal processing is transmitted via one of driver output terminals 16-1A or 16-1B from the gate driver circuit of master module 10-1 to one of driver input terminals 17-2A or 17-2B of the gate driver circuit of slave module 10-2 connected in parallel and is used there for controlling the power circuit breakers situated on circuit substrate 12-2.

According to the illustrated specific embodiment, driver output terminal 16-1B, which is electrically connected to the output terminal of the driver output stage, is connected via a first connecting line 18 to driver input terminal 17-1B, connected downstream from the driver output stage, of its own gate driver circuit and via a second connecting line 19 to driver input terminal 17-2B, connected downstream from the driver output stage, of the gate driver circuit of the inverter module 10-2 connected in parallel. In the illustrated exemplary embodiment, the possibility of connecting two connecting lines to the driver output terminal is achieved in that the corresponding contact point has two connection points. The line lengths of the connecting lines 18 and 19 are selected here in such a way that generally the same signal runtimes result. In the simplest case, this may be achieved in that the two connecting lines have the same length. However, depending on the application, other length ratios of the connecting lines may also result for implementing the same signal runtimes. The specific interconnection of the driver input and driver output terminals, which are connected downstream from the driver output stage, is thus selected in such a way that a signal path between the output terminal of the output stage and the power circuit breakers is initially interrupted without connecting line 18 and is closed only by connecting line 18. For the stand-alone operation, a simple short-circuit bridge may be used for closing this interruption.

The high-voltage side control signals, received in the described manner at driver input terminals 17-1B and 17-2B, are then relayed directly or via gate resistors (not illustrated) to the control input terminals of the particular power circuit breakers. Since the gate driver circuit of inverter module 10-2, which is connected in parallel to first inverter module 10-1, does not have to transmit signals from a low-voltage side to a high-voltage side, circuit substrate 13-2 does not have to be equipped correspondingly in first partial region 14-2, which results in a significant reduction of costs and effort.

As an alternative to the illustrated specific embodiment, other driver output and input terminals may also be electrically connected to one another via connecting lines 18 and 19. Fundamentally, every interconnection between one of the driver output terminals of the master module and one of the driver input terminals of the slave module is possible. For the application-specific wiring it, on the one hand, a reliable operation is ensured, i.e., the required voltage level for controlling the power circuit breakers is achieved without overloading a circuit component, and, on the other hand, the runtime differences are kept as low as possible; it must be taken into consideration, however, that not only the connecting lines, but also the individual circuit components contribute to increasing the signal runtimes. In the extreme case, depending on the configuration of connecting line 19, either the entire driver output stage of slave module 10-2 may be used, thus resulting in the necessity of correspondingly equipping gate driver circuit substrate 13-2 of slave module 10-2, or gate driver circuit substrate 13-2 of slave module 10-2 is used only as an interface for receiving a high-voltage side control signal, which may be used directly for controlling the power circuit breakers of slave module 10-2. In the last-mentioned case, equipping the driver output stage on gate driver circuit substrate 13-2 of slave module 10-2 may of course also be dispensed with.

Circuit substrates 13-1 and 13-2 may additionally have second driver input and output terminals (not illustrated). By electrically connecting the second driver output terminal of the gate driver circuit of master module 10-1 to the second input terminal of the gate driver circuit of slave module 10-2, the high-voltage side reference grounds of the gate driver circuits of the inverter modules connected in parallel are combinable.

Furthermore, the circuit substrates of the gate driver circuit may also have third driver input and output terminals (not illustrated). By electrically connecting the third driver output terminal of the gate driver circuit of master module 10-1 to the third input terminal of the gate driver circuit of slave module 10-2, the voltage supplies of the gate driver circuits of the inverter modules connected in parallel 10-1 and 10-2 are connectable in parallel. In this case, equipping a voltage monitoring circuit on circuit substrate 13-2 of gate driver circuit of slave module 10-2 may also be dispensed with, since this voltage monitoring is carried out by the corresponding circuit of the gate driver circuit of master module 10-1.

The example circuit substrate according to the present invention may thus be used universally and is the basis for creating an inverter module which is usable for various applications having different current and power requirements.

What is claimed is:

1. A circuit system, comprising: at least two inverter modules connected in parallel, each of the at least two inverter modules including an inverter circuit having power semiconductor circuit breakers, and a gate driver circuit for controlling the power semiconductor circuit breakers; wherein the gate driver circuit of a first one of the inverter modules transmits a control signal from a low-voltage side to a high-voltage side, the gate driver circuit including a first driver output terminal, which is electrically connected to first driver input terminals of the gate driver circuits of the inverter modules connected in parallel, and via which one of a high-voltage side control signal and a control signal deduced therefrom, is transmittable to the gate driver circuits of the inverter modules connected in parallel; wherein the power semiconductor circuit breakers of the inverter circuits of the first inverter module and of the inverter modules, which are connected in parallel to the first inverter module, are controlled based on the one of the high-voltage side control signal and the control signal deduced therefrom, wherein the gate driver circuit is electrically connected to the first driver output terminal; and wherein the gate driver circuit of the first one of the inverter modules has a second driver output terminal which is electrically connected to second driver input terminals of the gate driver circuits of the inverter modules connected in parallel, and via which high-voltage side reference grounds of the gate driver circuits of the inverter modules connected in parallel are combinable.

2. The circuit system as recited in claim 1, wherein each of the inverter modules has a DC link capacitor which is used for stabilizing an input voltage of the respective inverter circuit.

3. The circuit system as recited in claim 1, wherein the gate driver circuit of the first one of the inverter modules monitors at least one of: i) the power semiconductor circuit breakers, and ii) a voltage supply for the gate driver circuit.

4. The circuit system as recited in claim 1, wherein the gate driver circuit of the first one of the inverter modules also has a first driver input terminal via which one of the high-voltage side control signal or a control signal deduced therefrom is receivable based on which the power semiconductor circuit breakers of the inverter circuit of the first inverter module are controlled, and the first driver output terminal of the gate driver circuit of the first one of the inverter modules is electrically connected via connecting lines to the first driver input of the gate driver circuit of the first one of the inverter modules and to the first driver input terminals of the gate driver circuits of the inverter modules connected in parallel, line lengths of the connecting lines being established in such a way that a same signal runtimes result.

5. A method for connecting at least two inverter modules in parallel, each of the inverter modules including an inverter circuit having power semiconductor circuit breakers, and a gate driver circuit for controlling the power semiconductor circuit breakers, the method comprising: connecting the inverter modules so that a control signal transmitted by a gate driver circuit of a first one of the inverter modules from a low-voltage side to a high-voltage side, at least one of a high-voltage side control signal or a control signal deduced therefrom is transmitted to the gate driver circuits of the inverter modules connected in parallel, and the power semiconductor circuit breakers of the inverter circuits of the first one of the inverter modules and the inverter modules connected in parallel are controlled based on the at least one of the high-voltage side control signal and the control signal deduced therefrom; and wherein the gate driver circuit is electrically connected to a first driver output terminal and wherein the gate driver circuit of the first one of the inverter modules has a second driver output terminal which is electrically connected to second driver input terminals of the gate driver circuits of the inverter modules connected in parallel, and via which high-voltage side reference grounds of the gate driver circuits of the inverter modules connected in parallel are combinable.

6. A circuit substrate for a gate driver circuit of an inverter module, wherein the gate driver circuit is used for controlling power semiconductor circuit breakers of an inverter circuit of the inverter module, the circuit substrate being equippable in a first partial region with an arrangement for implementing a signal transmission of a control signal from a low-voltage side to a high-voltage side, and the circuit substrate comprising: at least one first driver output contact point via which one of a high-voltage side control signal or a control signal deduced therefrom, which is used to control the inverter circuit, is transmittable to gate driver circuits of inverter modules connected in parallel to the inverter module; at least one first driver input contact point via which one of the high-voltage side control signal or a control signal deduced therefrom is receivable based on which power semiconductor circuit breaker of the inverter module connected in parallel are controlled; wherein the first driver output contact point and the first driver input contact point are electrically connected to the gate driver circuit; and wherein the circuit substrate has a second driver output contact point and a second driver input contact point, the second driver output contact point being electrically connectable to the second driver input contact point of the gate driver circuits of the inverter modules connected in parallel, and high-voltage side reference grounds of gate driver circuits of the inverter modules connected in parallel are thereby combinable.

7. The circuit substrate as recited in claim 6, wherein voltage supplies of the gate driver circuits of the inverter modules connected in parallel are thereby connectable in parallel.

8. The circuit substrate as recited in claim 6, wherein the first driver output contact point is short-circuited with the first driver input contact point during a stand-alone operation of the inverter module.

* * * * *